United States Patent [19]
Divine et al.

[11] Patent Number: 5,907,263
[45] Date of Patent: May 25, 1999

[54] BIAS CURRENT CALIBRATION OF VOLTAGE CONTROLLED OSCILLATOR

[75] Inventors: James Divine; Jeffrey Niehaus; John Pacourek; Baker Scott, III, all of Austin, Tex.

[73] Assignee: Cirrus Logic, Inc., Del.

[21] Appl. No.: 08/970,841

[22] Filed: Nov. 14, 1997

[51] Int. Cl.$^6$ ................................................ H03L 7/099

[52] U.S. Cl. .............................. 331/16; 331/34; 331/44; 331/177 R

[58] Field of Search .................................. 331/16, 34, 44, 331/177 R

[56] References Cited

U.S. PATENT DOCUMENTS 5,382,922  1/1995  Gersbach et al. ...................... 331/1 A

*Primary Examiner*—Siegfried H. Grimm
*Attorney, Agent, or Firm*—James J. Murphy, Esq.; Winstead Sechrest & Minick; J. P. Violette, Esq. Cirrus Logic, Inc.

[57] ABSTRACT

A voltage controlled oscillator with bias current calibration includes a voltage controlled oscillator 1504. A tuning current source 1510 is coupled to oscillator 1504 in parallel with bias current source 1512 for providing a tuning current to oscillator 1504. A selected control voltage is provided by oscillator 1504 for setting an oscillator output frequency. Control circuitry 1513, 1514 allows adjusting of the tuning current source to optimize bias current.

15 Claims, 3 Drawing Sheets

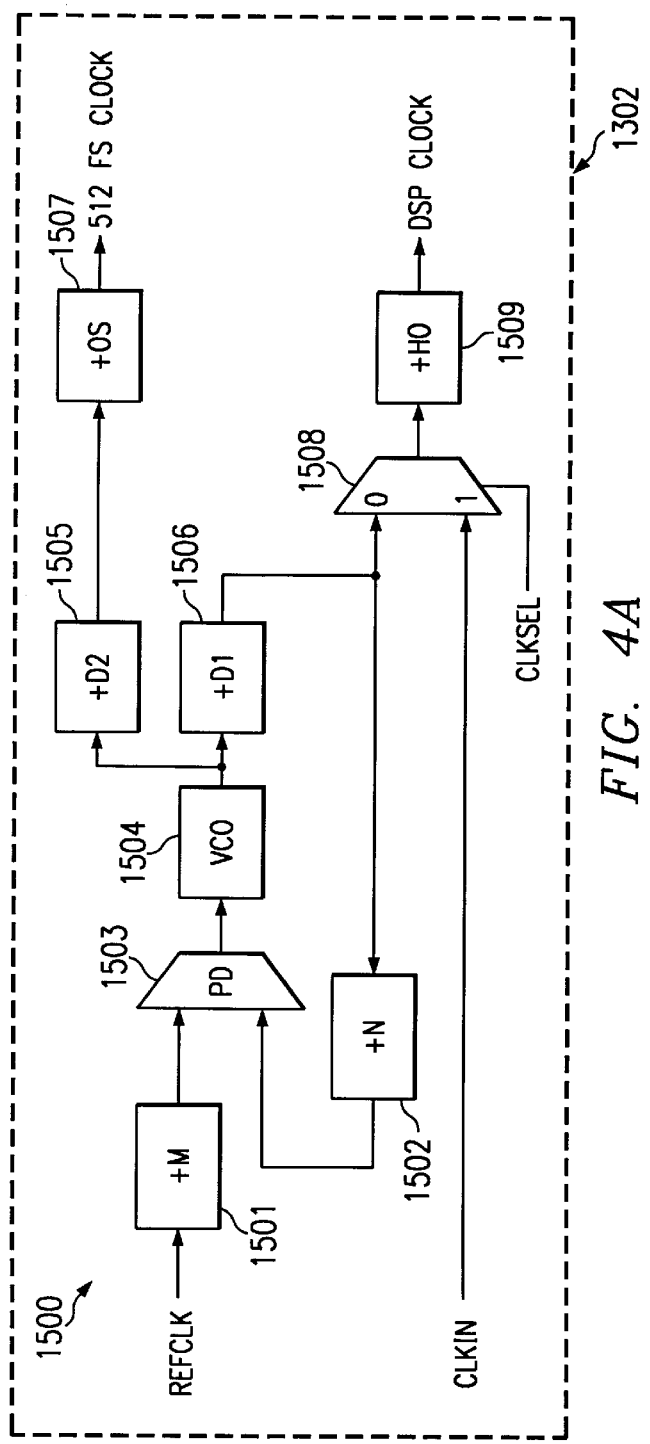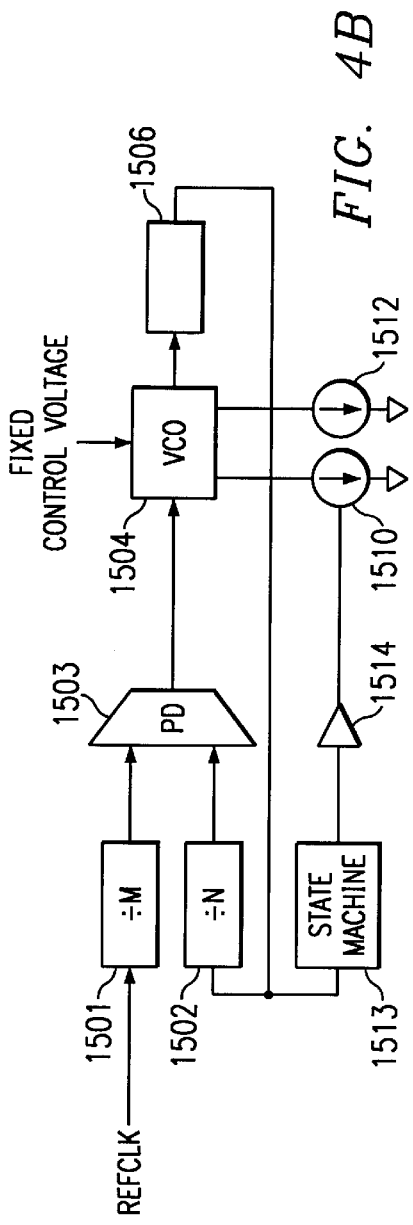
FIG. 4A
FIG. 4B

BIAS CURRENT CALIBRATION OF VOLTAGE CONTROLLED OSCILLATOR

CROSS-REFERENCE TO RELATED APPLICATIONS

The following co-pending and co-assigned applications contain related information and are hereby incorporated by reference:

Ser. No. 08/970,979, entitled "DIGITAL AUDIO DECODING CIRCUITRY, METHODS AND SYSTEMS", filed Nov. 14, 1997;

Ser. No. 08/970,794, entitled "METHODS FOR BOOTING A MULTIPROCESSOR SYSTEM", filed Nov. 14, 1997;

Ser. No. 08/970,372, entitled "METHODS FOR DEBUGGING A MULTIPROCESSOR SYSTEM", filed Nov. 14, 1997;

Ser. No. 08/969,883, entitled "INTER-PROCESSOR COMMUNICATION CIRCUITRY AND METHODS", filed Nov. 14, 1997;

Ser. No. 08/969,884, entitled "METHODS FOR UTILIZING SHARED MEMORY IN A MULTIPROCESSOR SYSTEM", filed Nov. 14, 1997;

Ser. No. 08/970,796, entitled "ZERO DETECTION CIRCUITRY AND METHODS", filed Nov. 14, 1997;

Ser. No. 08/971,080, entitled "METHOD FOR ERROR CONCEALMENT IN AN AUDIO DECODING SYSTEM", filed Nov. 14, 1997; and Ser. No. 08/970,302, entitled "METHODS FOR EXPONENT HANDLING IN AN AUDIO DECODING SYSTEM", filed Nov. 14, 1997.

BACKGROUND OF THE INVENTION

1. Field of the Invention

The present invention relates in general to audio data processing and in particular, to digital audio decoding circuitry and methods and systems using the same.

2. Description of the Related Art

The ability to process audio information has become increasingly important in the personal computer (PC) environment. Among other things, audio is important in many multimedia applications, such as gaming and telecommunications. Audio functionality is therefore typically available on most conventional PCs, either in the form of an add-on audio board or as a standard feature provided on the motherboard itself. In fact, PC users increasingly expect not only audio functionality but high quality sound capability. Additionally, digital audio plays a significant role outside the traditional PC realm, such as in compact disk players, VCRs and televisions. As the audio technology progresses, digital applications are increasingly sophisticated as improvements in sound quality and sound effects are sought.

One of the key components in many digital audio information processing systems is the decoder. Generally, the decoder receives data in a compressed form and converts that data into a decompressed digital form. The decompressed digital data is then passed on for further processing, such as filtering, expansion or mixing, conversion into analog form, and eventually conversion into audible tones. In other words the decoder must provide the proper hardware and software interfaces to communicate with the possible compressed (and decompressed) data sources, as well as the destination digital and/or audio devices. In addition, the decoder must have the proper interfaces required for overall control and debugging by a host microprocessor or microcontroller. Since, there are a number of different audio compression/decompression formats and interface definitions, such as Dolby AC-3 and S/PDIF (Sony/Phillips Digital Interface), a state of the art digital audio decoder should at least be capable of supporting multiple compression/decompression formats.

Digital systems normally require a voltage controlled oscillator or similar clock generation circuitry for establishing the operating time base. To maximize system flexibility, it is desirable to have a variable or tunable clock generator capable of providing variable frequency clocks. This is especially true for devices and systems such as audio decoders which must be adaptable to several operating environments. Since tuning of the clock frequency must be done with some degree of accuracy, the need has arisen for techniques precisely calibrating a voltage controlled oscillator circuitry, particular for those incorporated in audio processing devices.

SUMMARY OF THE INVENTION

According to the principles of the present invention, a voltage controlled oscillator with bias current calibration is disclosed which includes a voltage controlled oscillator, a bias current source coupled to the oscillator, and a tuning source coupled to the oscillator in parallel with the bias current source for providing a tuning current to the oscillator. A selected voltage is also coupled to the oscillator for setting the oscillator output frequency. Circuitry for adjusting the tuning current source is provided for optimizing the bias current.

These principles can be applied to any situation in which a voltage controlled oscillator or similar clock generation circuitry must be calibrated. In one particular instance, the principles of the present invention may be a variable of generation circuit in an audio processing device or system.

BRIEF DESCRIPTION OF THE DRAWINGS

For a more complete understanding of the present invention, and the advantages thereof, reference is now made to the following descriptions taken in conjunction with the accompanying drawings, in which:

FIG. 4A is a diagram of the phased-locked loop circuitry (PLL) of clock manager of FIG. 3; and FIG. 4B generally depicts the circuitry used for VCO bias calibration.

DESCRIPTION OF THE PREFERRED EMBODIMENTS

The principles of the present invention and their advantages are best understood by referring to the illustrated embodiment depicted in FIG. 1–4B of the drawings, in which like numbers designate like parts.

Figure 1A:
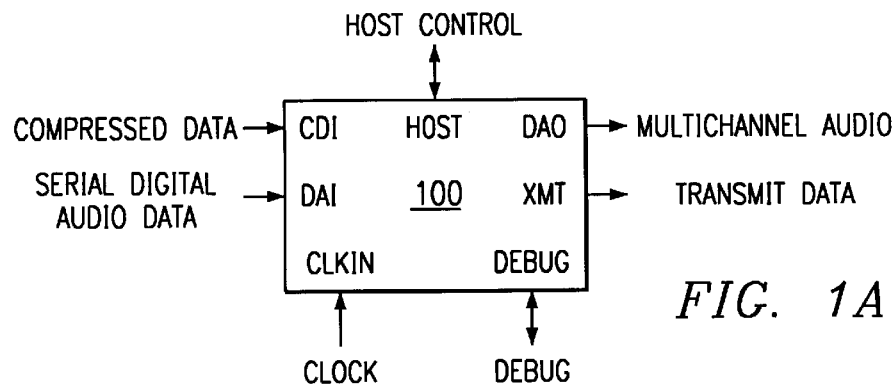
FIG. 1A is a diagram of a multichannel audio decoder embodying the principles of the present invention.

FIG. 1A is a general overview of an audio information decoder 100 embodying the principles of the present invention. Decoder 100 is operable to receive data in any one of a number of formats, including compressed data in conforming to the AC-3 digital audio compression standard, (as defined by the United States Advanced Television System Committee) through a compressed data input port CDI. An independent digital audio data (DAI) port provides for the input of PCM, S/PDIF, or non-compressed digital audio data.

A digital audio output (DAO) port provides for the output of multiple-channel decompressed digital audio data. Independently, decoder 100 can transmit data in the S/PDIF (Sony-Phillips Digital Interface) format through a transmit port XMT.

Decoder 100 operates under the control of a host microprocessor through a host port HOST and supports debugging by an external debugging system through the debug port DEBUG. The CLK port supports the input of a master clock for generation of the timing signals within decoder 100.

While decoder 100 can be used to decompress other types of compressed digital data, it is particularly advantageous to use decoder 100 for decompression of AC-3 bits streams.

Therefore, for understanding the utility and advantages of decoder 100, consider the case of when the compressed data received at the compressed data input (CDI) port has been compressed in accordance with the AC-3 standard.

Generally, AC-3 data is compressed using an algorithm which achieves high coding gain (i.e., the ratio of the input bit rate to the output bit rate) by coarsely quantizing a frequency domain representation of the audio signal. To do so, an input sequence of audio PCM time samples is transformed to the frequency domain as a sequence of blocks of frequency co-efficient. Generally, these overlapping blocks, each of 512 time samples, are multiplied by a time window and transformed into the frequency domain. Because the blocks of time samples overlap, each PCM input sample is represented by two sequential blocks factor transformation into the frequency domain. The frequency domain representation may then be decimated by a factor of two such that each block contains 256 frequency coefficients, with each frequency coefficient represented in binary exponential notation as an exponent and a mantissa.

Next, the exponents are encoded into coarse representation of the signal spectrum (spectral envelope), which is in turn used in a bit allocation routine that determines the number of bits required to encoding each mantissa. The spectral envelope and the coarsely quantized mantissas for six audio blocks (1536 audio samples) are formatted into an AC-3 frame. An AC bit stream is a sequence of the AC-3 frames.

In addition to the transformed data, the AC bit stream also includes a number of additional information. For instance, each frame may include a frame header which indicates the bit rate, sample rate, number of encoded samples, and similar information necessary to subsequently synchronize and decode the AC-3 bit stream. Error detection codes may also inserted such that the device such as decoder 100 can verify that each received frame of AC-3 data does not contain any errors. A number of additional operations may be performed on the bit stream before transmission to the decoder. For a more complete definition of AC-3 compression, reference is now made to the digital audio compression standard (AC-3 ) available from the advanced televisions systems committee, incorporated herein by reference.

In order to decompress under the AC-3 standard, decoder 100 essentially must perform the inverse of the above described process. Among other things, decoder 100 synchronizes to the received AC-3 bit stream, checks for errors and deformats received AC-3 data audio. In particular, decoder 100 decodes spectral envelope and the quantitized mantissas. Among other things, a bit allocation routine is used to unpack and de-quantitize the mantissas. The spectral envelope is encoded to produce the exponents, then, a reverse transformation is performed to transform the exponents and mantissas to decoded PCM samples in the time domain.

Figure 1B:
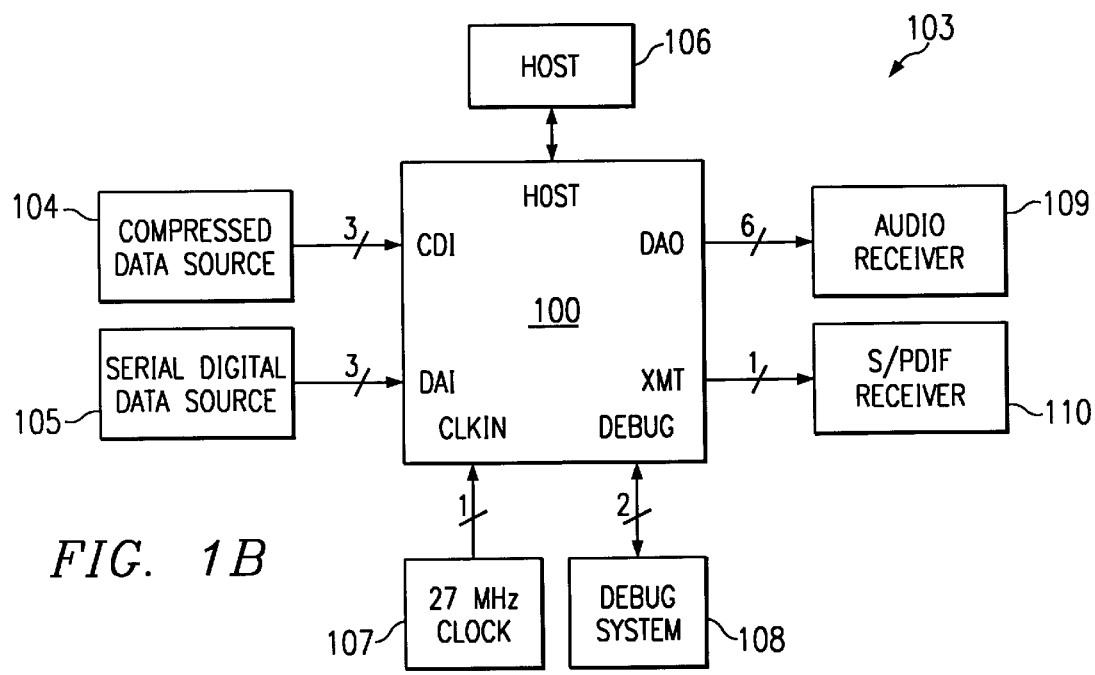
FIG. 1B is a diagram showing the decoder of FIG. 1 in an exemplary system context.

FIG. 1B shows decoder 100 embodied in a representative system 103. Decoder 100 as shown includes three compressed data input (CDI) pins for receiving compressed data from a compressed audio data source 104 and an additional three digital audio input (DAI) pins for receiving serial digital audio data from a digital audio source 105. Examples of compressed serial digital audio source 105, and in particular of AC-3 compressed digital sources, are digital video discs and laser disc players.

Host port (HOST) allows coupling to a host processor 106, which is generally a microcontroller or microprocessor that maintains control over the audio system 103. For instance, in one embodiment, host processor 106 is the microprocessor in a personal computer (PC) and System 103 is a PC-based sound system. In another embodiment, host processor 106 is a microcontroller in an audio receiver or controller unit and system 103 is a non-PC-based entertainment system such as conventional home entertainment systems produced by Sony, Pioneer, and others. A master clock, shown here, is generated externally by clock source 107. The debug port (DEBUG) consists of two lines for connection with an external debugger, which is typically a PC-based device.

Decoder 100 has six output lines for outputting multi-channel audio digital data (DAO) to digital audio receiver 109 in any one of a number of formats including 3-lines out, 2/2/2, 4/2/0, 4/0/2 and 6/0/0. A transmit port (XMT) allows for the transmission of S/PDIF data to an S/PDIF receiver 110. These outputs may be coupled, for example, to digital to analog converters or codecs for transmission to analog receiver circuitry.

Figure 1C:
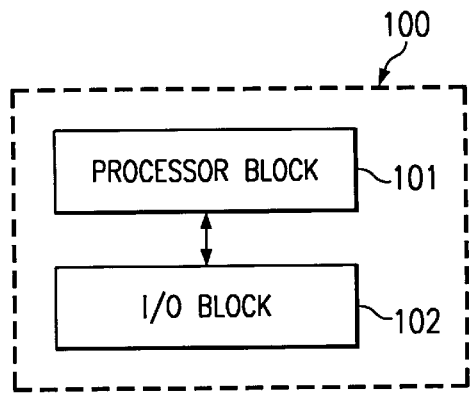
FIG. 1C is a diagram showing the partitioning of the decoder into a processor block and an input/output (I/O) block.

FIG. 1C is a high level functional block diagram of a multichannel audio decoder 100 embodying the principles of the present invention. Decoder 100 is divided into two major sections, a Processor Block 101 and the I/O Block 102. Processor Block 106 includes two digital signal processor (DSP) cores, DSP memory, and system reset control. I/O Block 102 includes interprocessor communication registers, peripheral I/O units with their necessary support logic, and interrupt controls. Blocks 101 and 102 communicate via interconnection with the I/O buses of the respective DSP cores. For instance, I/O Block 102 can generate interrupt requests and flag information for communication with Processor Block 101. All peripheral control and status registers are mapped to the DSP I/O buses for configuration by the DSPs.

Figure 2:
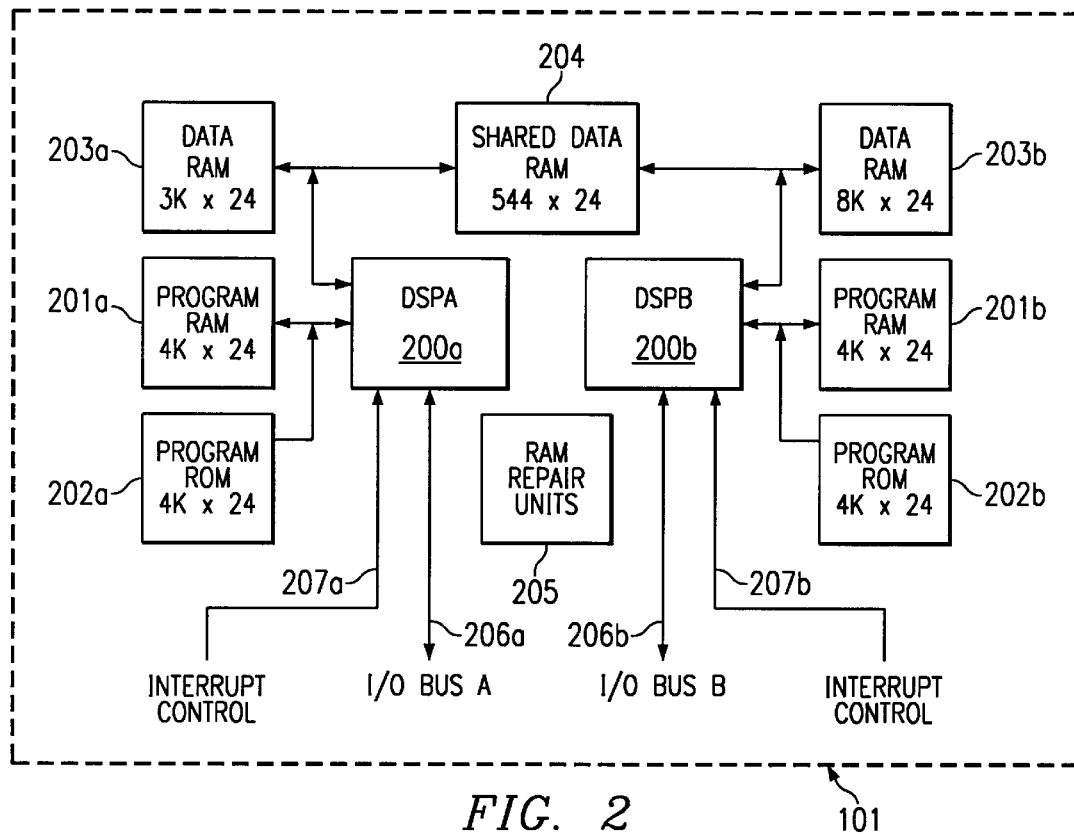
FIG. 2 is a diagram of the processor block of FIG. 1C.

FIG. 2 is a detailed functional block diagram of processor block 101. Processor block 101 includes two DSP cores 200a and 200b, labeled DSPA and DSPB respectively. Cores 200a and 200b operate in conjunction with respective dedicated program RAM 201a and 201b, program ROM 202a and 202b, and data RAM 203a and 203b. Shared data RAM 204, which the DSPs 200a and 200b can both access, provides for the exchange of data, such as PCM data and processing coefficients, between processors 200a and 200b. Processor block 101 also contains a RAM repair unit 205 that can repair a predetermined number of RAM locations within the on-chip RAM arrays to increase die yield.

DSP cores 200a and 200b respectively communicate with the peripherals through I/O Block 102 via their respective I/O buses 206a, 206b. The peripherals send interrupt and flag information back to the processor block via interrupt interfaces 207a, 207b.

As shown in FIG. 2, DSPs 200a and 200b are each associated with program and data RAM blocks 202 and 203. Data Memory 203 typically contains buffered audio data and intermediate processing results. Program Memory 201/202 (referring to Program RAM 201 and Program ROM 202 collectively) contains the program running at a particular time. Program Memory 201/202 is also typically used to store filter coefficients, as required by the respective DSP 200a and 200b during processing.

Figure 3:
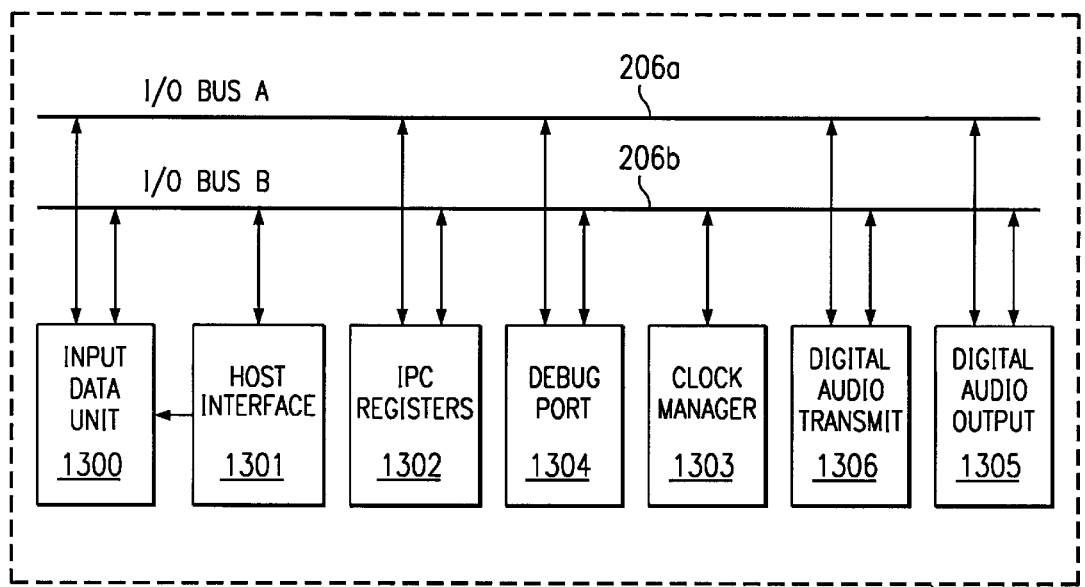
FIG. 3 is a diagram of the primary functional subblock of the I/O block of FIG. 1C.

FIG. 3 is a detailed functional block diagram of I/O block 102. Generally, I/O block 102 contains peripherals for data input, data output, communications, and control. Input Data Unit 1200 accepts either compressed analog data or digital audio in any one of several input formats (from either the CDI or DAI ports). Serial/parallel host interface 1301 allows an external controller to communicate with decoder 100 through the HOST port. Data received at the host interface port 1301 can also be routed to input data unit 1300.

IPC (Inter-processor Communication) registers 1302 support a control-messaging protocol for communication between processing cores 200 over a relatively low-bandwidth communication channel. High-bandwidth data can be passed between cores 200 via shared memory 204 in processor block 101.

Clock manager 1303 is a programmable PLL/clock synthesizer that generates common audio clock rates from any selected one of a number of common input clock rates through the CLKIN port. Clock manager 1303 includes an STC counter which generates time stamp information used by processor block 101 for managing playback and synchronization tasks. Clock manager 1303 also includes a programmable timer to generate periodic interrupts to processor block 101.

Debug circuitry 1304 is provided to assist in applications development and system debug using an external DEBUGGER and the DEBUG port, as well as providing a mechanism to monitor system functions during device operation.

A Digital Audio Output port 1305 provides multichannel digital audio output in selected standard digital audio formats. A Digital Audio Transmitter 1306 provides digital audio output in formats compatible with S/PDIF or AES/EBU.

In general, I/O registers are visible on both I/O buses, allowing access by either DSPA (200a) or DSPB (200b). Any read or write conflicts are resolved by treating DSPB as the master and ignoring DSPA.

The phase-locked loop circuitry (PLL) of clock manager 1303 is shown in FIG. 4A, generally at 1500. PLL includes input divider 1501, a divider 1502 in the feedback loop, phase-frequency detector 1503, voltage controlled oscillator (VCO) 1504, dividers 1505, 1506 and 1507 at the output of VCO 1504, an output multiplexer 1508 and output divider 1509. PLL 1500 is configured to produce the appropriate master clock for the desired sample rate. All other internal clocks required for the DSP and the peripherals are derived from this root clock.

PLL 1500 generates the master clock by locking a reference clock (REFCLK) to a divided down version of the master clock (CLKIN). Typically, the reference clock is input from the CLKIN pin, but other possibilities are the recovered clock from the S/PDIF input or the sample clock from input unit 1200. The reference clock source is selected by the REFCLK field in a clock manager control register (CMCTL) and divided by an 11-bit M value by divider 1501. The output of divider 1501 is input to the phase-frequency detector 1503. The other input to the phase-frequency detector is the divided version of the master clock. The output of the phase-frequency detector controls the output frequency of the VCO 1504.

TABLE 1

Clock Manager Control Register

| Name | Bits | Description |
|---|---|---|
| /LOCK | 23 | PLL lock indicator. Low when PLL is locked. |
| /VBLOCK | 22 | VCO Bias lock indicator. Transitions low when the VCO bias current calibration sequence has been completed |
| HILO | 21 | Frequency indicator flag for VCO bias calibration. When: 0: VCO frequency less than reference frequency 1: VCO frequency greater than reference frequency. |
|  | 20:17 | Reserved. |
| VCOB | 16:11 | VCO Bias value. Controls bias current to the VCO |
| TCM | 10 | Test mode. Drives D1 and D2 1505, 1506 dividers with DSP clock instead of VCO output. Allows controlled test visibility for all dividers. |
| LDS | 9 | Lock detector sensitivity. When set, this bit uses a wider range to determine if PLL is in lock. |
| LKIEN | 8 | PLL lock interrupt enable. When set, a rising edge of /LOCK generates an interrupt to the DSP. |
| BLEN | 7 | Bias lock enable. When set, enables the VCO bias calibration sequence. |
| VCOC | 6:3 | Loop filter capacitor value. |
| VCOEN: | 2 | VCO Enable. When clear, the VCO tuning voltage is set to its nominal value and the VCO is enabled to track tuning voltage changes. |
| REFCLK | 1:0 | Reference clock source selector: 00: reference clock = CLKIN 01: reference clock = recovered S/PDIF clock; 10: reference clock = SCLKN 11: reference clock =- CMPCLK |

TABLES 2 and 3 describe the Clock Manager divider registers 1 and 2, respectively assigned to DSP pages 2 at addresses 0×1A and 0×1B. These registers are used to set the divider circuits of PLL 1500.

TABLE 2

Clock Manager Divider Register 1

| Name | Bits | Description |
|---|---|---|
| RDSW | 23 | Read switch. When cleared, reading M, N, or OS values provides values written to modulo register. When set, reading M, N, or OS gives actual counter value for test visibility. |
| M | 22:12 | 11-bit value for divide-by-M counter. Cleared by reset. |

TABLE 2-continued

Clock Manager Divider Register 1

| Name | Bits | Description |
| --- | --- | --- |
| N | 11:0 | 12-bit value for divide-by-N counter. Cleared by reset. |

TABLE 3

Clock Manager Divider Register

| Name | Bits | Description |
| --- | --- | --- |
|  | 23:11 | Reserved |
| D1 | 10:9 | D1 divider value, where:<br>11: divide-by-3<br>00: divide-by-4 (default value on reset)<br>01: divide-by-5<br>10: divide-by-6 |
| D2 | 8:7 | D2 divider value, where<br>00: divide-by-1<br>01: divide-by-2<br>10: divide-by-3<br>11: divide-by-4 |
| OS | 6:2 | 5-bit value for divide-by-OS counter. Set to 1 (divide-by-2) on reset. Zero is invalid value for this field. |
| HO | 1:0 | Hold-off divider, where:<br>00: divide-by-1<br>01: divide-by-2<br>10: divide-by-3 (default value on reset)<br>11: divide-by-4 |

The output frequency range of VCO 1504 is 150 MHz to 270 MHz across process and temperature. VCO 1504 is controlled by the VCOEN and VCOB fields in the clock manager control register. These two control fields are used together when configuring and locking the PLL. Clearing the VCOEN bit fixes the VCO control voltage to its nominal value and causes the VCO to output its nominal clock frequency (approximately 200 MHz). When the VCOEN bit is cleared, the phase-frequency detector 1504 output has no effect on the VCO output frequency. The VCOB field is a six-bit value that controls the bias current to VCO 1504. The VCOB value can be adjusted to control the nominal frequency of VCO 1504. Upon reset, VCOEN is cleared, and the D1 and HO dividers (1506 and 1509 respectively) are set to their default values of ÷4 and ÷3, respectively, giving an open-loop DSP clock of 12.5 MHz to 22.5 MHz.

The PLL's internal VCO requires a filter capacitor to be connected to the FLT1 and FLT2 pins (discussed below). The typical value of the filter capacitor is 0.22 uf, which is sufficient for all allowable reference input frequencies. To achieve the best analog performance the capacitor is placed as close as possible to the FLT pins and proper layout precautions taken to avoid noise coupling onto the FLT pins.

The master clock output from VCO 1504 is divided down to generate the DSP clock, the 512 Fs clock, and the feedback clock to the phase-frequency detector controlling the VCO. Specifically, the master clock is divided by the D1 value by divider 1506 to generate the DSP clock, which is typically 50 MHz. The master clock is also divided by the D2 and OS values (respectively by dividers 1505 and 1507) to generate the 512 Fs Clock, which is used to synchronize the audio input and output blocks and is typically in the range of 8 MHz to 24 MHz. The DSP output from divider 1506 clock is further divided by the 12-bit N value in divider 1502 to generate the feedback clock for the PLL. The feedback clock range at the phase-frequency detector is extremely large, but in general will always be above 14 KHz.

Because of the wide range of feedback clock values and the bandwidth of the loop, there is an additional field that controls the on-chip loop filter components. The 4-bit VCOC field allows setting the optimum on-chip filter capacitance for the loop filter given the phase detector frequency. The proper VCOC value is determined by the effective feedback divider, which is calculated by multiplying the D1 and N values. The preferred VCOC settings are provided in TABLE 23:

| D1 * N Value | VCOC |
| --- | --- |
| Less than 2,500 | 0000 |
| 2,500–5,000 | 1000 |
| 5,000–7,500 | 1100 |
| 7,500–10,000 | 1110 |
| Greater than 10,000 | 1111 |

The HO field also affects the DSP clock rate by inserting an additional divider to slow down the DSP clock during PLL configuration. This prevents the DSP clock from exceeding the maximum rated speed while the PLL is locking. Once locked, the HO field can be cleared, allowing the DSP clock to run at full speed.

The PLL can be bypassed completely by tying the CLKSEL pin high. This muxes the CLKIN input pin directly in as the DSP clock.

The TCM bit in the CMCTL register enables the clock manager test mode. This mode drives the D1 and D2 (1505 and 1506) dividers with the DSP clock instead of the VCO output. This gives controlled test visibility of the divider chains. Also, the DSP clock can be directed to the MCLK pin for test and debug of the PLL. Control for this feature is included in the Digital Audio Output section along with other MCLK pin configuration control.

In order to reduce VCO gain tolerances, a VCO bias current calibration circuit is included to compensate for process variations in the bias circuitry. The bias calibration is automatic, but can also be controlled manually if necessary. FIG. 4B generally depicts the circuitry used for VCO bias calibration, including a tuning current source 1510, bias current source 1512, state machine 1513 and D/A converter 1514.

The VCO calibration is enabled by writing a one to the bias lock enable bit (BLEN) after configuring the PLL registers for a given sample rate and reference clock. In particular, the PLL is configured such that the inputs to Phase Detector are equal. A fixed control voltage is applied to VCO and on a rising edge of BLEN, the calibration sequence is initiated. The VCOB field is reset to 0×20 (the middle of its range) and state machine 1513 adjusts the tuning bias current source 1510 searching for the optimum VCO bias value. Specifically, the optimum bias value is determined by optimizing the VCO output frequency for the output frequency selected in register for the fixed control voltage. Upon completion, the VCO bias lock (VBLOCK) flag is cleared, signifying that the bias value is "locked".

Alternatively, the VCO bias calibration can be performed under software control if the BLEN bit is cleared. The DSP can write values to the VCOB field and monitor the HILO flag after a N*32 DSP clock delay to determine if the VCO output frequency is higher or lower than desired. The delay is required to give a sufficient number of clocks at the phase-frequency detector to determine the relationship between the reference and feedback clocks.

Phase-frequency detector 1503 and an additional frequency comparator (not shown) are utilized to continuously monitor the PLL. When the PLL is locked, the LOCK flag will go low. If the PLL loses lock, the LOCK flag will be set. A low to high transition of the LOCK flag will cause an interrupt if the lock interrupt enable bit (LKIEN) is set.

The LDS bit in the CMCTL register controls the lock detector sensitivity. When set, the LDS bit relaxes the conditions used to determine whether the PLL is in lock. This can reduce lock time and sensitivity to noise, but could increase the risk of a false lock and allow more variation in the VCO output clock frequency. In general, the LDS bit should remain cleared for normal operation.

A preferred PLL configuration and lock procedure is as follows:

(1) write the desired divide ratio to the HO field, slowing the DSP clock;

(2) clear the VCOEN and BLEN bits to set the VCO to its nominal frequency and reset the VCO bias calibration circuit; configure the N, M, D1, D2, OS, and VCOC values as necessary for the desired sample rate and DSP frequency;

(3) if bias calibration is to be done automatically, set the BLEN bit to start the VCO bias calibration;

(4) wait for the VBLOCK flag to go low, indicating that the VCO bias has been set appropriately and set the VCOEN bit to enable PLL; alternatively, if bias calibration is to be performed under software control, leave the BLEN bit cleared, perform a software search for the optimum VCOB value by writing a VCOB value, waiting for an appropriate delay (N*32 DSP clocks), reading the HILO flag, and updating the VCOB value. Once the best VCOB value is found, set the VCOEN bit to enable the PLL; and (5) once the VCOEN bit is set, wait for the LOCK flag to go low, indicating that the PLL is locked and stable, and then clear the HO field to restore the DSP clock to the desired frequency.

The principles of the present invention described above can be applied to any voltage controlled crystal oscillator, especially one that is on an integrated circuit chip. In particular, these principles can be applied to reduce gain tolerances and/or account for process variations.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. A voltage controlled oscillator with bias current calibration comprising:
   a voltage controlled oscillator;
   a bias current source coupled to said oscillator for providing a fixed bias current to the oscillator;
   a tuning current source coupled to said oscillator in parallel with said bias current source for providing a tuning current to the oscillator;
   a source of a selected control voltage coupled to the oscillator for setting an oscillator output frequency; and
   circuitry for adjusting the tuning current source to adjust said bias current to optimize said output frequency to a value represented by said control voltage.

2. The voltage controlled oscillator of claim 1 wherein said source of said selected control voltage comprises an output of a phase detector, said phase detector having first and second inputs each receiving a signal at an equal selected frequency.

3. The voltage controlled oscillator of claim 2 wherein said first input receives a reference clock and said second input receives a divided down feedback signal from an output of said oscillator.

4. The voltage controlled oscillator of claim 1 wherein said circuitry for adjusting comprises a state machine.

5. An integrated circuit comprising:
   a voltage controlled oscillator;
   a first current source for providing a preselected fixed bias current;
   a control voltage source for selecting an output frequency of said oscillator; and
   calibration circuitry including a tunable second current source in parallel with said first current source for adjusting said output frequency, said calibration circuitry enabled in response to a bit of digital information.

6. The integrated circuit of claim 5 and further comprising a phased locked loop including a phase detector having a first input for receiving a reference frequency, a second input for receiving feedback driven by said oscillator, and an output for driving a voltage control input of said oscillator.

7. The integrated circuit of claim 6 and further comprising at least one frequency divider for equalizing a frequency received at said first input of said phase detector with a frequency received at said second input of said phase detector.

8. The integrated circuit of claim 7 and further comprising a register for storing digital data for selecting said output frequency of said oscillator.

9. The integrated circuit of claim 7 wherein said at least one frequency divider is disposed in a feedback loop providing said feedback to said second input of said phase detector.

10. The integrated circuit of claim 7 wherein said at least one frequency divider selectively divides said reference frequency.

11. The integrated circuit of claim 8 wherein said digital data selects a frequency in the middle of a range of possible frequencies.

12. A method of calibrating a voltage controlled oscillator comprising the steps of:
   providing a fixed bias current to the oscillator;
   providing a tuning current to the oscillator in parallel with the fixed bias current;
   setting an oscillator output frequency with a fixed control voltage; and adjusting the tuning current source to adjust the bias current and optimize the output frequency to a value represented by said control voltage.

13. The method of claim 12 wherein said step of setting an oscillator output frequency comprises the step of loading a digital value in a control register.

14. The method of claim 12 wherein said step of setting an oscillator output frequency comprises the step of setting the frequency to a frequency in the middle of a range of possible frequencies.

15. The method of claim 12 wherein said step of providing a fixed control voltage comprises the step of generating a control voltage in a phase locked loop having a phase detector receiving a selected reference clock and a clock received from a feedback loop.

* * * * *